United States Patent [19]

DuPree et al.

[11] Patent Number: 5,277,782
[45] Date of Patent: Jan. 11, 1994

[54] BAFFLED COLD SHIELDS FOR INFRARED DETECTOR

[75] Inventors: Donald G. DuPree, Alta Loma; David L. Gregory, Covina; Robert J. Housman, Irvine, all of Calif.

[73] Assignee: Optical Radiation Corporation, Azusa, Calif.

[21] Appl. No.: 959,449

[22] Filed: Oct. 13, 1992

Related U.S. Application Data

[62] Division of Ser. No. 806,765, Dec. 13, 1991.

[51] Int. Cl.$^5$ .............................................. C25D 1/02
[52] U.S. Cl. ...................................................... 205/67
[58] Field of Search ........................................ 205/67

[56] References Cited
FOREIGN PATENT DOCUMENTS
122090 5/1990 Japan .

Primary Examiner—T. M. Tufariello
Attorney, Agent, or Firm—Christie, Parker & Hale

[57] ABSTRACT

An infrared cold shield comprises a side wall, a top wall and at least one baffle extending across the interior of the cold shield. The top wall and baffles comprise aligned apertures. The cold shield is preferably made by securing one or more metal foil disks and aluminum mandrel segments in an alternating stacked arrangement wherein the outer edges of the metal foil disks are exposed. The assembly is then electroplated to deposit a layer of metal over the side surfaces of the mandrel segments and to capture and bond with the exposed edges of the metal foil sections. The mandrel segments are then dissolved.

13 Claims, 5 Drawing Sheets

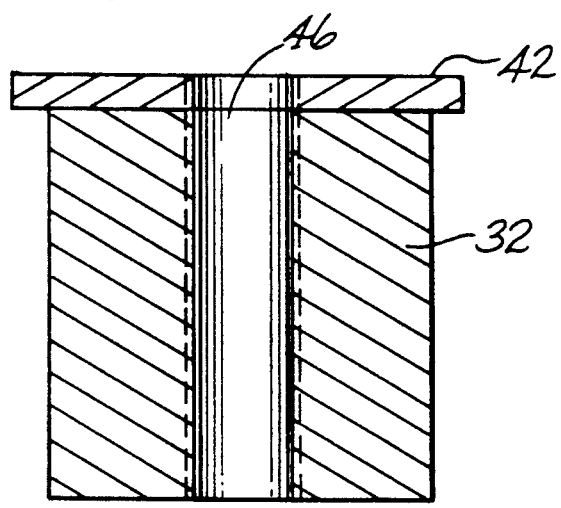
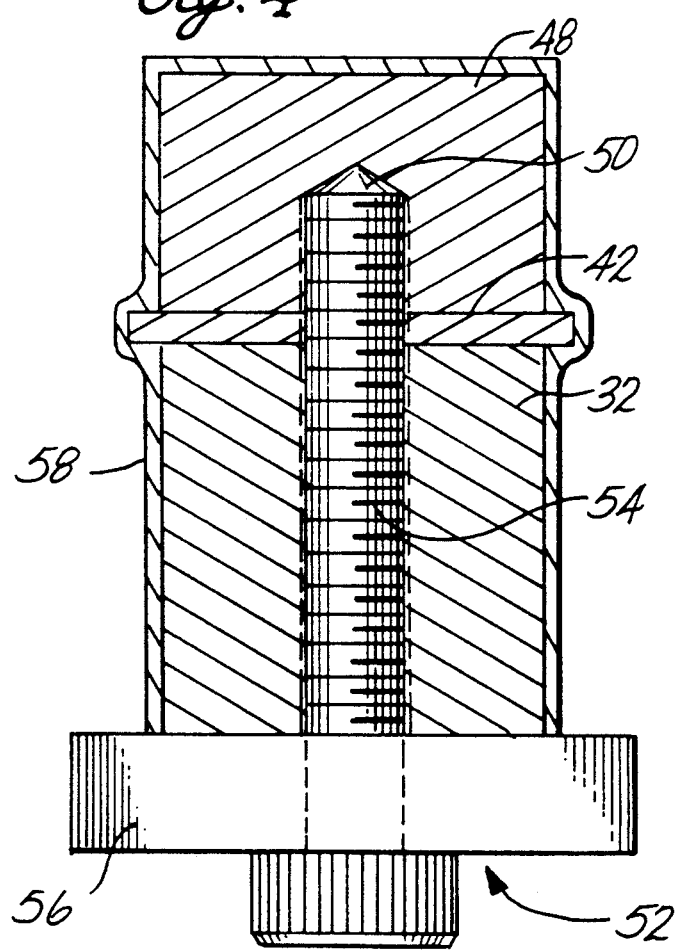

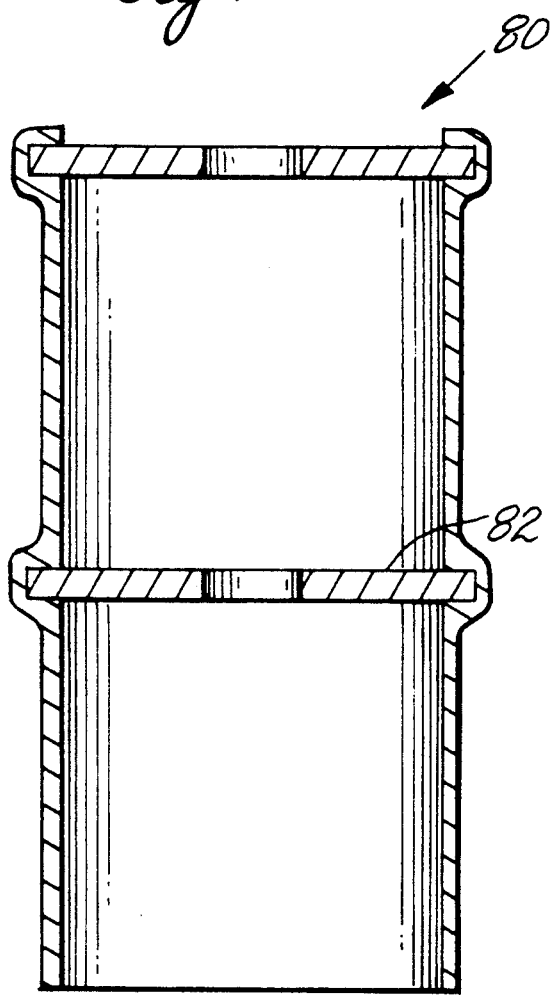

BAFFLED COLD SHIELDS FOR INFRARED DETECTOR

This is a division of application Ser. No. 07/806,765 filed Dec. 13, 1991.

FIELD OF THE INVENTION

This invention relates to the field of infrared absorbent shields and more particularly to an infrared absorbent shield having one or more internal baffles and a process for producing the same.

BACKGROUND OF THE INVENTION

Infrared (IR) detectors used in IR cameras, IR guidance systems for missiles, and the like require a thin metal shield to surround the detector. The shield, sometimes referred to as a cold shield or radiation shield, protects the detector from stray IR radiation. The shield typically has an aperture in the top to allow a prescribed cone of light to strike the detector contained within the shield.

Cold shields are often made by electrodepositing nickel, copper, nickel-cobalt, or combinations of such metals onto an aluminum mandrel. Often, the aluminum mandrel is coated with a zinc deposit and/or copper strike prior to the actual forming so that the electrodeposited metal will adhere to the mandrel surface and thereby prevent loss of adhesion during electrodeposition on postplate machining. After the electrodeposition operation is complete and post-plate machining accomplished, the aluminum mandrel is dissolved, e.g., in an alkaline solution such as sodium hydroxide. The zinc and/or copper strike coating is then stripped off the interior of the shield once the mandrel has been dissolved.

The shields are ordinarily coated on the outside surface with gold or other materials that are reflective to IR radiation. The shields are generally coated on their interior surfaces with materials that are absorbent to IR radiation. Such interior and exterior coatings are used to minimize the amount of stray IR radiation impinging on the detector.

As can be appreciated, there is an ongoing need to improve the accuracy of IR detectors, and hence to reduce the amount of stray IR radiation hitting the detector.

SUMMARY OF THE INVENTION

The present invention provides a cold shield for infrared detectors comprising a side wall, a top wall having an aperture and one or more internal baffles. The baffles extends across the internal cross section of the cold shield, preferably parallel to the top wall. Each baffle comprises an aperture aligned with the aperture in the top wall.

The invention further comprises methods for providing a baffled cold shield. In one method, a first mandrel segment made of aluminum or other platable and dissolvable material is provided. A foil of metal is established at the top surface of the first mandrel segment, said metal foil extending beyond the perimeter of the top surface of the mandrel segment, preferably a distance of from about 0.003 to about 0.005 in.

A second mandrel segment made of aluminum or other platable and dissolvable material is mounted on top of the metal foil. The size of the second mandrel segment is selected so that the metal foil extends beyond the perimeter of the bottom surface of the second mandrel segment, preferably a distance of from about 0.003 to about 0.005. The first and second mandrel segments and the metal foil therebetween are secured together and immersed in a plating solution. A layer of infrared absorbing metal is electroplated over the mandrel segments and exposed metal foil. The mandrel segments are then dissolved to yield a cold shield comprising an external housing of electroplated metal and an internal baffle made of the metal foil.

In a preferred embodiment of the invention, the metal foil is established by immersing the first mandrel segment in an electroplating solution and electrolytically depositing a layer of metal on at least the top surface of the mandrel segment. The side wall of the mandrel segment is machined without machining the metal deposited on the top surface of the mandrel section. This provides an electrodeposited metal foil extending beyond the side surfaces of the first mandrel segment.

In another preferred embodiment of the invention, the metal foil is established by cutting or stamping a section of metal foil in the desired shape and size from a sheet of such metal foil. The cut or stamped metal foil is then mounted between the first and second mandrel sections.

In yet another preferred embodiment of the invention, the top wall and internal baffle of the cold shield are established by mounting a first section of metal foil between first and second mandrel segments and a second section of metal foil on the top surface of the second mandrel segment. The first and second sections of metal foil are cut or stamped in the desired shape and size preferably including an aperture, from a sheet of such metal foil. The first and second metal foil sections extend beyond the perimeters of the first and second mandrel segments. The metal foil sections and mandrel segments are then clamped together and immersed in electroplating solution. A layer of metal is electrolytically deposited over at least the sides of the first and second mandrel segments, capturing the edges of the metal foil sections. The mandrel segments are then dissolved to yield a cold shield with an internal baffle.

BRIEF DESCRIPTION OF THE DRAWINGS

These and other features and advantages of the present invention will be better understood by reference to the following detailed description when considered in conjunction with the accompanying drawings wherein:

FIG. 3 is a cross-sectional view of the mandrel of FIG. 2 after machining;

FIG. 4 is a cross-sectional view of an electroplated mandrel assembly mounted on a fixture used in the formation of the cold shied of FIG. 5;

FIG. 7 is a cross-sectional view of a cold shield manufactured in accordance with FIGS. 5 and 6.

DETAILED DESCRIPTION

Figure 1:
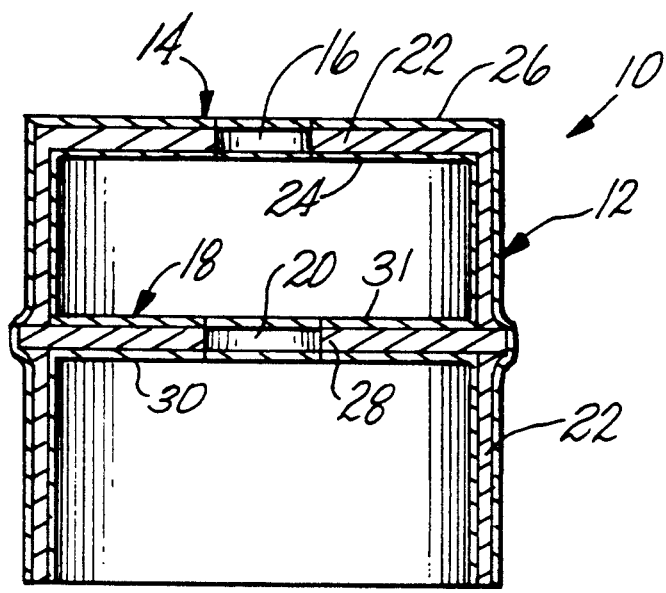
FIG. 1 is a cross-sectional view of a cold shield constructed in accordance with the present invention.

A presently preferred baffled cold shield constructed in accordance with the present invention is shown in FIG. 1. The cold shield 10 comprises a generally cylindrical side wall 12 and a generally flat top wall 14. A central or axial aperture 16 is present in the top wall 14. An internal baffle 18 generally parallel to the top wall extends across the interior of the cold shield. The baffle 18 comprises an axial aperture 20 generally the same size and shape as the aperture 16 of the top wall 14.

The side wall 12 and top wall 14 of the cold shield 10 preferably have a construction comprising three layers. The construction includes a middle layer 22 of from about 0.001 to about 0.010 inch thick made of a platable material, preferably nickel, copper, nickel-cobalt alloy or combinations thereof. Other metals which may be electrolytically deposited over a dissolvable mandrel may be used, if desired.

An inner layer 24 of IR absorbent material coats the inner surface of the metal layer. The IR absorbent material is preferably from about 0.0002 to about 0.00002 inch thick. A particularly preferred IR absorbent layer comprises aluminum oxide which is mechanically bonded to the middle layer 22. Such an IR absorbent layer and process for its manufacture are described in application Ser. No. 07/673,231 entitled Infrared Absorbent Shield, filed Mar. 20, 1991 and assigned to Optical Radiation Corporation which is incorporated herein by reference. On the exterior surface of the middle layer is an outer layer 26 of IR reflective material, preferably gold. The thickness of the outer layer is preferably about 0.00005 inch.

In the embodiment shown, the internal baffle 18 is a construction comprising three layers. The middle layer 28 is from about 0.001 to about 0.010 inch thick and preferably comprises nickel, copper or nickel-cobalt alloy. On the bottom surface of the middle layer is a lower layer 30 of IR absorbent material, preferably about 0.000002 to about 0.00002 inch thick. The IR absorbent material is preferably aluminum oxide which is mechanically anchored to the middle layer 28. On the upper surface of the middle layer 28 is a top layer 31 of black chrome, copper sulfide or other IR absorbing material.

Figure 2:
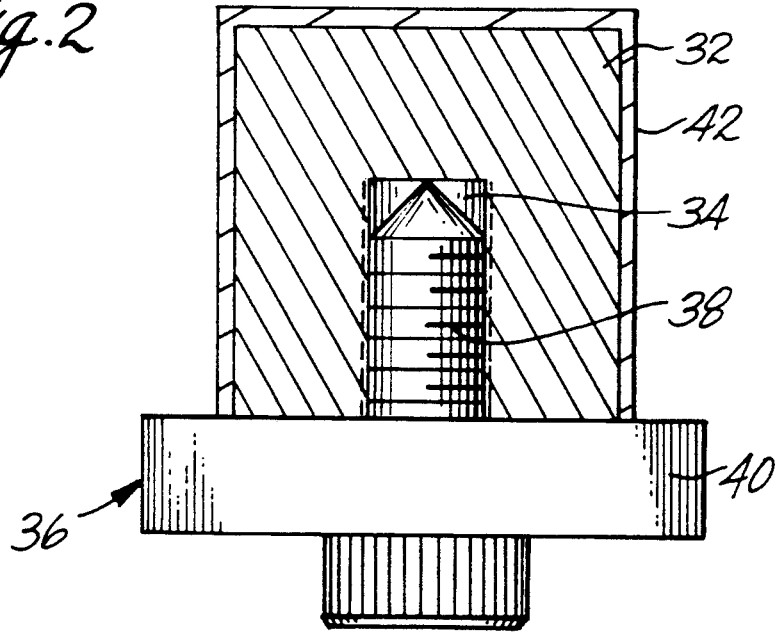
FIG. 2 is a cross-sectional view of an electroplated aluminum mandrel mounted on a fixture used in formation of the cold shield of FIG. 1.

A preferred process for the manufacturer of a shield as shown in FIG. 1 is depicted in FIGS. 2-4. With reference to FIG. 2, a first mandrel segment 32 made of a platable and dissolvable material is first provided. The presently preferred material for the first mandrel segment 32 is aluminum although other selectively dissolvable metals may be used if desired.

In the embodiment shown, the first mandrel segment 32 is generally cylindrical and has flat top and bottom surfaces. The diameter of the first mandrel segment is selected to be slightly greater than the diameter of the desired cold shield. The first mandrel segment comprises a threaded blind axial hole 34 extending upwardly from it's bottom surface for attachment to fixture 36. Fixture 36 comprises a conductive threaded post 38 which is threaded into hole 34. Fixture 36 further comprises a nonconductive disk 40 which engages the bottom surface of the first mandrel segment 32. The disk 40 prevents plating on the bottom surface of the first mandrel segment.

The first mandrel segment 32 and fixture 36 are immersed in an aluminum anodizing solution to form a porous layer of aluminum oxide over the side and top surfaces of the first mandrel segment. Such a process is described more fully in the U.S. patent application Ser. No. 07/073,231 which is incorporated herein by reference. Preferred anodizing solutions include phosphoric acid anodizing solutions. Anodizing is continued until the formed aluminum oxide layer obtains a suitable thickness, preferably from about 0.000002 inch to about 0.00002 inch.

The anodized first mandrel segment 32 and 36 are then immersed in a plating solution, preferably a nickel, copper, or nickel-cobalt alloy plating solution and a layer of metal 42 is electrolytically deposited over the side and top surfaces of the first mandrel segment. Electrodeposition is continued until the deposited metal on the top surface forms a metal foil layer having a thickness of from about 0.001 to about 0.010 and preferably from about 0.002 to about 0.005 inch.

With reference to FIG. 3 the sidewall of the first mandrel segment 32 is then machined without machining the electrodeposited metal layer 42 deposited on the top surface of the first mandrel segment. The machining removes the electrolytically deposited layer of metal and reduces the diameter of the first mandrel segment so that the electrolytically deposited metal layer 42 on the top surface extends beyond the side surfaces of the first mandrel segment by about 0.003 to about 0.005 inch. That is, the diameter of the electroplated metal layer 44 on the top surface is from about 0.003 to about 0.005 inch greater than the diameter of the machined first mandrel segment. An axial bore 46 is also machined through the first segment and the top electrolytically deposited metal layer 42.

With reference to FIG. 4, a second mandrel segment 48 is then provided having a diameter about the same as the diameter of the machined first mandrel segment 32. The second mandrel segment 48 is generally cylindrical with flat top and bottom walls. The second mandrel segment comprises a threaded blind hole 50 for mounting onto a second fixture 52. The second mandrel segment 48 is mounted over the electrolytically deposited metal foil layer 42 on the top surface of the first mandrel segment and secured in place by the second fixture 52. The second fixture comprises a central post 54 which extends through the axial bore of the first mandrel segment 32 and threads into the threaded hole 50 of the second mandrel segment 48. A nonconductive disk 56 engages the bottom surface of the first mandrel segment 32 to prevent plating on that bottom surface. A protective coating, e.g. paint, is then applied onto the exposed edges of the metal foil layer 42.

The fixture 52 and first and second mandrel segments 32 and 48 are then immersed in an anodizing solution and the exposed aluminum surfaces are anodized as described above. The protective coating on the edges of the metal foil layer 42 is then stripped by, for example, immersion in a suitable solvent.

As an alternative, the first and second mandrel segments 32 and 48 could be anodized separately. In such a procedure, the metal foil layer 42 on the first mandrel segment 32 is protected during anodizing. This can be done, for example, by applying a coating over the metal foil layer 42 which is resistant to the anodizing solution. Alternatively, a rubber cap or the like can be fitted over the metal foil layer 42 to prevent contact with the anodizing solution.

Following anodizing, the fixture 52 with assembled anodized first and second mandrel segments 32 and 48 are then immersed in a plating solution, preferably a nickel, copper or nickel-cobalt alloy plating solution, and a metal layer 58 is electrolytically deposited over the exposed side surfaces of the first and second mandrel segments and over the top surface of the second mandrel segment. The electrolytically deposited metal layer 58 captures and bonds to the exposed edges of the electrodeposited metal layer 42 on the top surface of the first mandrel segment 32 as shown in FIG. 4. Electrodeposition is continued until the thickness of the electrodeposited metal layer 58 is from about 0.001 to about 0.010 and preferably from about 0.002 to about 0.005 inch.

The electroplated mandrel segments are then immersed in a second plating solution from which a layer of an IR reflective metal, preferably gold, is deposited over the first layer of electrodeposited metal. The electrodeposition of the IR reflective metal is preferably continued until a thickness of about 0.00005 is achieved.

The fixture 52 is then removed and the mandrel segment 32 and electroplated layer 58 are machined to the desired length. The aluminum mandrel segments 32 and 58 are then dissolved to form the baffled cold shield of FIG. 1. Dissolution of the aluminum is by immersion in a solution capable of dissolving aluminum without dissolving the electrodeposited metal or the aluminum oxide coating. Dissolution of the aluminum mandrel can be accomplished in a variety of acid or alkaline solutions. A presently preferred solution is sodium hydroxide at 8 to 16 ounces per gallon. The solution may be maintained at room temperature up to about 250° F. Other suitable solutions for dissolving the aluminum mandrel include potassium hydroxide or hydrochloric acid if diluted to about 50% strength and maintained at a temperature below about 100° F.

Once the mandrel is dissolved, the anodized layer is firmly attached to the interior of the deposited metal body. The metal which is electrolytically deposited into the pores and which is exposed to the surface of the aluminum oxide layer is preferably oxidized. This may be accomplished by immersion in oxidizing solutions, such as hydrogen peroxide, or by heating to 400° to 600° F. in air. If the electrodeposited metal is copper, a copper sulfide coating may be formed, for example, by exposing to a polysulfide solution or to a commercially available conversion coating.

Figure 5:
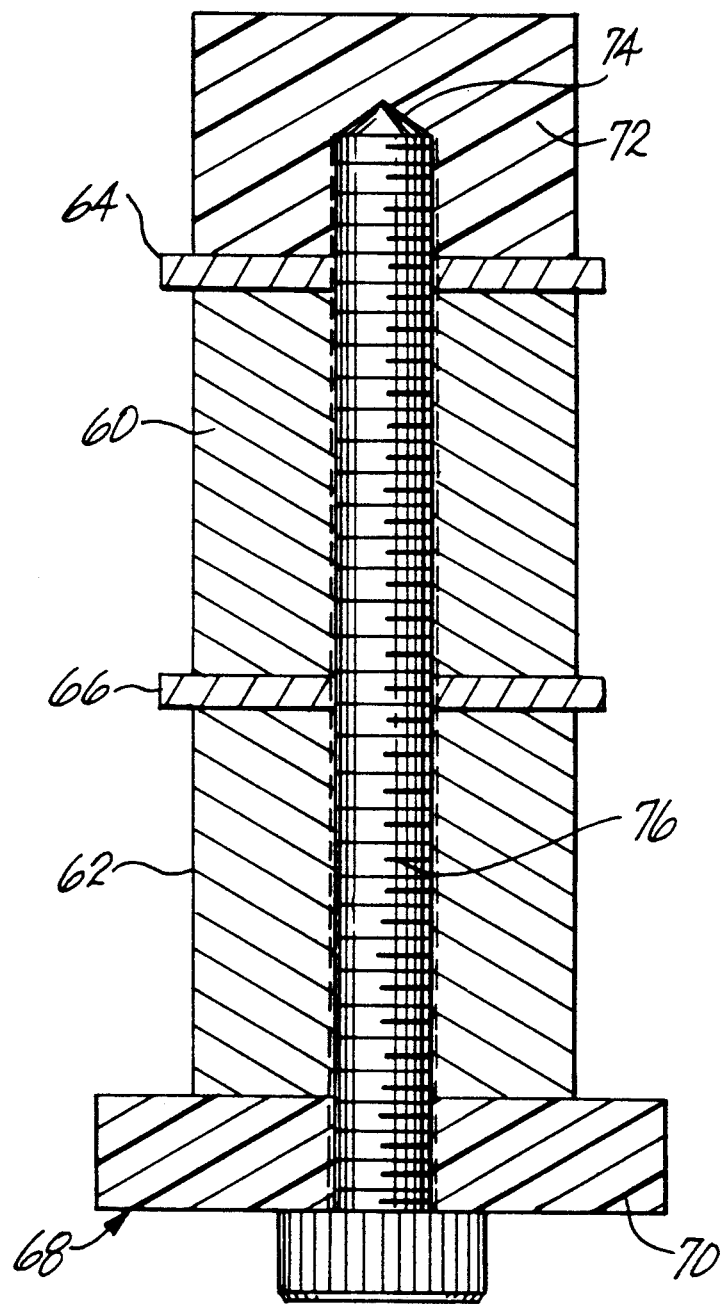
FIG. 5 is a cross-sectional view of another mandrel assembly mounted on a fixture.
Figure 6:
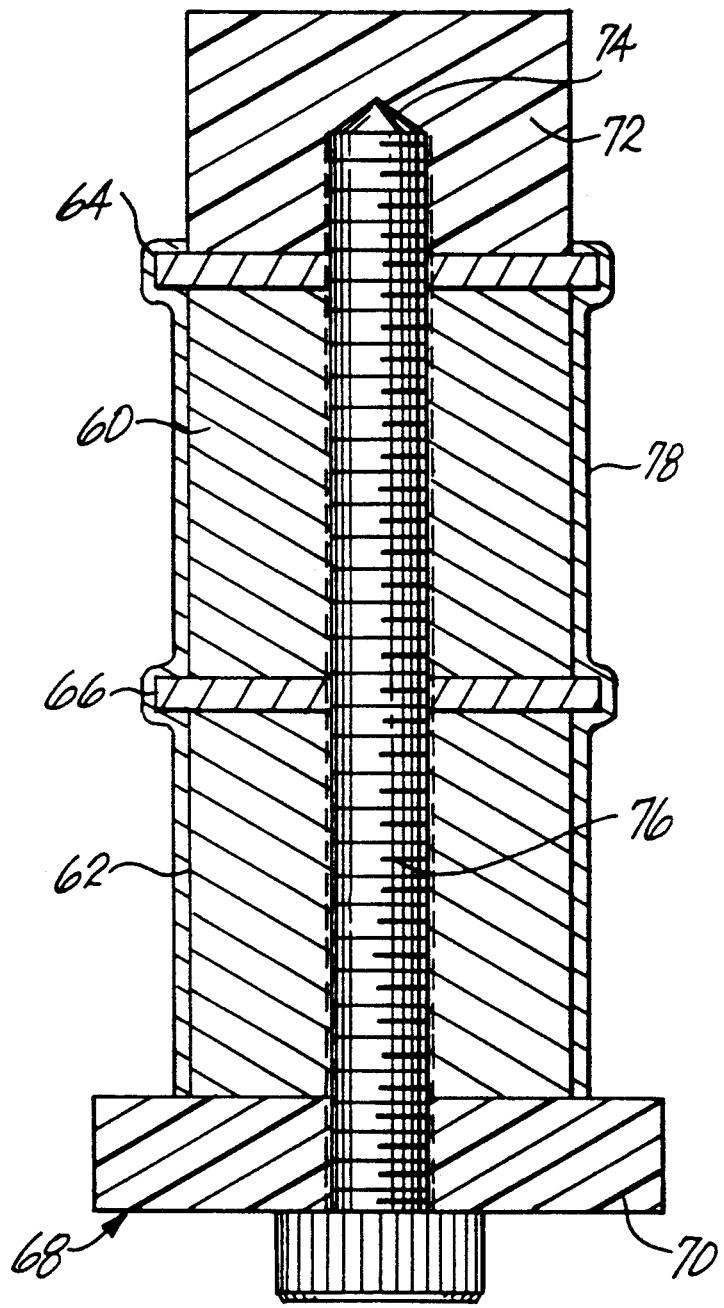
FIG. 6 is a cross-sectional view of the mandrel assembly of FIG. 5 after electroplating.

Another preferred process for preparing a baffled cold shield is shown in FIGS. 5 to 7. In this embodiment, first and second cylindrical aluminum mandrel sections 60 and 62 each having an axial bore are provided. The mandrel sections are preferably anodized, at least on their side surfaces. Two annular disks 64 and 66 of metal foil are also provided. The annular foil disks 64 and 66 have an outer diameter slightly greater than the diameters of the mandrel sections 60 and 62. The inner diameter of the annular foil sections is selected to provide the desired aperture diameter for the cold shield.

The annular foil disks 64 and 66 may be stamped or cut from a sheet of metal foil or formed by any other desired method. Preferably, the metal of the metal foil disks is selected from the group of copper, nickel or nickel-cobalt. If desired, the annular foil disks may comprise a layer of aluminum oxide on their bottom surface. Further, if desired, the annular foil disk 64 which forms the top wall of the cold shield may comprise a layer of gold or other IR reflective material on its top surface and the annular foil disk 66 which forms the internal baffle may comprise a layer of IR absorbent material such as electroplated black chrome or a conversion coating of copper sulfide or copper oxide or the like.

The mandrel sections 60 and 62 and annular foil disks 64 and 66 are mounted on a fixture 68 in the arrangement shown in FIG. 5. One annular disk 66 is mounted between the mandrel sections 60 and 62 with its outer edges protruding beyond the side surfaces of the mandrel sections. The other annular foil disk 64 is mounted on the top surface of the second mandrel section 60.

The fixture 68 comprises a first dielectric or non-platable disk 70 mounted against the bottom surface of the first mandrel section 62 and a second dielectric or non-platable disk 62 mounted against the top surface of the second annular foil disk 64. The first non-platable disk 70 has a diameter greater than the diameter of the first mandrel section 62 to completely shield the bottom surface of the first mandrel section from plating during the subsequent electrodeposition step. The first non-platable 70 disk also has an axial bore.

The second non-platable disk 72 has a diameter less than the diameter of the second annular foil disk 64 so that the outer edges of the second annular foil disk 64 are completely exposed. The second non-platable disk 72 has an axial threaded blind hold 74 for receiving the threaded end of a post 76 which extends through the axial bore in the first non-platable disk, the mandrel disks and the annular foil disks.

The assembly comprising the fixture 68, mandrel sections 60 and 62 and annular foil disks 64 and 66 are then immersed in an electroplating solution and a layer of metal 78, preferably copper, nickel or nickel-cobalt alloy, is electrolytically deposited over the side surfaces of the mandrel sections 60 and 62 and the exposed edges of the annular foil disks 64 and 66 as shown in FIG. 6. The resultant electrodeposited metal may then be gold plated if desired.

The fixture 68 is then removed and the aluminum mandrel sections are machined, if required, and dissolved as described above. The resultant cold shield 80 with an interior baffle 82 is shown in FIG. 7.

It is clear that in either of the above methods, the number of baffles may be as many as desired. For example, in the second method described above, to obtain two interior baffles, one simply clamps together three mandrel sections and three annular foil sections and then processes that assembly in the same manner as described.

It is equally apparent that the spacing between baffles or between the baffle and top wall of the cold shield may vary as desired. The size and shape of the mandrel sections or the aperture may also vary as desired.

For the above reasons, the foregoing description should not be read as pertaining only to the precise structure and processes described above, but rather should be read consistent with and as support, for the following claims which are to have their fullest fair scope.

What is claimed is:

1. A process for preparing a cold shield having at least one interior baffle comprising:

providing first and second mandrel segments each having a top and bottom surface and a side surface, said mandrel segments being made of a platable and dissolvable material;

establishing a first layer of metal different from the material of the first mandrel segment over the top surface of the first mandrel segment;

mounting the second mandrel segment over the first metal layer, whereby at least the outer edge of the first metal layer are exposed;

immersing the first and second mandrel segments and first metal layer therebetween in an electroplating solution and electrolytically depositing a second layer of metal over the side surfaces of the first and second mandrel segments and the top surface of the second mandrel segment whereby the outer edge of the first metal layer is bonded to the second metal layer;

establishing a bore through the second metal layer extending over the top surface of the second mandrel segment and through the first and second mandrel segments and first metal layer; and dissolving the first and second mandrel segments.

2. A process as claimed in claim 1 wherein the metal of the first metal layer is selected from the group consisting of copper, nickel and nickel-cobalt alloy.

3. A process as claimed in claim 1 wherein the outer edge of the first metal layer extends radially outwardly beyond the side walls of the first and second mandrel segments a distance of from about 0.003 to about 0.005 inch.

4. A process as claimed in claim 1, whereby the first metal layer is established over the top surface of the first mandrel segment by immersing the first mandrel segment in an electroplating solution and electrolytically depositing the first layer of metal over at least the top surface of the first mandrel segment.

5. A process as claimed in claim 4 wherein a metal layer is also electrolytically deposited over at least a portion of the side surface of the first mandrel segment and wherein the process further comprises, prior to mounting the second mandrel segment over the first metal layer, machining the side surfaces of the first mandrel segment so that the first metal layer extends beyond the diameter of the machined first mandrel segment.

6. A process as claimed in claim 1 wherein the first metal layer is established over the top surface of the first mandrel segment by positioning a foil of the metal of the first metal layer over the top surface of the first mandrel segment.

7. A process for preparing a cold shield having at least one interior baffle comprising:

providing at least two mandrel segments, each having a top and bottom surface and a side surface, said mandrel segments being made of a platable and dissolvable material;

establishing a first layer of metal different from the material of the first mandrel segment over the top surface of each mandrel segment;

mounting the mandrel segments and first metal layers in a stacked arrangement, whereby at least the outer edge of each first metal layer is exposed;

immersing the mandrel segments and first metal layers in an electroplating solution and electrolytically depositing a second layer of metal over at least the side surfaces of the mandrel segments whereby the outer edges of the first metal layers bond to the second metal layer;

establishing a bore through the first metal layers and mandrel segments; and dissolving the mandrel segments.

8. A process as claimed in claim 7 wherein the metal of the first metal layer is selected from the group consisting of copper, nickel and nickel-cobalt alloy.

9. A process as claimed in claim 7, whereby the first metal layer is established over the top surface of at least one mandrel segment by immersing the mandrel segment in an electroplating solution and electrolytically depositing the first layer of metal over at least the top surface of the mandrel segment.

10. A process as claimed in claim 9 wherein a metal layer is also electrolytically deposited over at least a portion of the side surface of the mandrel segment and wherein the process further comprises machining the side surfaces of the mandrel segment so that the first metal layer extends beyond the diameter of the machined first mandrel segment.

11. A process as claimed in claim 7 wherein the first metal layer is established over the top surface of at least one mandrel segment by positioning a metal foil of the metal of the first metal layer over the top surface of the mandrel segment.

12. A process for preparing a cold shield having at least one interior baffle comprising:

providing at least two mandrel segments, each having a top and bottom surface and a side surface, said mandrel segments being made of a platable and dissolvable material;

positioning a section of foil comprising metal different from the material of the first mandrel segment over the top surface of each mandrel segment, said metal foil section comprising a hole;

securing the mandrel segments and metal foil sections in a stacked arrangement, whereby at least the outer edge of each metal foil sections are exposed;

immersing the second stacked arrangement in an electroplating solution and electrolytically depositing a layer of metal over at least the side surfaces of the mandrel segments whereby the outer edges of the metal foil sections are bonded to the electrolytically deposited metal layer; and dissolving the mandrel segments.

13. A process as claimed in claim 12 wherein the outer edges of the metal foil sections extend outwardly beyond the side surfaces of the mandrel segments a distance of from about 0.003 to about 0.005 inch.

* * * * *